(12) United States Patent
Katoh

(10) Patent No.: US 6,207,006 B1
(45) Date of Patent: Mar. 27, 2001

(54) VACUUM PROCESSING APPARATUS

(75) Inventor: Susumu Katoh, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/156,752

(22) Filed: Sep. 16, 1998

(30) Foreign Application Priority Data

Sep. 18, 1997 (JP) .................................................. 9-253610
Sep. 18, 1997 (JP) .................................................. 9-253611

(51) Int. Cl.[7] .............................. C23F 1/02; C23C 16/00; C23C 14/00
(52) U.S. Cl. ............... 156/345; 204/298.33; 204/298.31; 204/298.07; 204/298.09; 118/723 R; 118/715
(58) Field of Search ....................... 156/345; 204/298.33, 204/298.07, 298.09, 298.31; 118/723 R, 715

(56) References Cited

U.S. PATENT DOCUMENTS

| | | | |
|---|---|---|---|
| 2,859,812 | 11/1958 | Swanson | 160/368.1 |
| 2,861,712 | 11/1958 | Bermingham | 220/315 |
| 3,955,702 | 5/1976 | Lundy | 220/4.28 |

(List continued on next page.)

FOREIGN PATENT DOCUMENTS

| | | | |
|---|---|---|---|
| 0546178 | 6/1993 | (EP) . | |
| 750994 | 6/1956 | (GB) . | |
| 52-67353 | 3/1977 | (JP) . | |
| 57-104218 | 6/1982 | (JP) . | |
| 58-93323 | 6/1983 | (JP) . | |
| 58-131430 | 8/1983 | (JP) . | |
| 59-124140 | 7/1984 | (JP) . | |
| 59-177368 | 10/1984 | (JP) . | |
| 60-3121 | 1/1985 | (JP) . | |
| 62-26756 | 2/1987 | (JP) . | |
| 63-17521 | 1/1988 | (JP) . | |
| 63-109438 | 7/1988 | (JP) . | |
| 63-168949 | 7/1988 | (JP) . | |
| 63-216283 | 9/1988 | (JP) . | |
| 3-242929 | 10/1991 | (JP) | H01L/21/30 |
| 4-124076 | 4/1992 | (JP) | C04B/41/87 |
| 4-336421 | 11/1992 | (JP) | C23C/14/48 |
| 4-358074 | 12/1992 | (JP) | C23C/16/46 |
| 5-129210 | 5/1993 | (JP) | C23C/16/46 |

*Primary Examiner*—Nam Nguyen
*Assistant Examiner*—Deborah Chacko-Davis
(74) *Attorney, Agent, or Firm*—Morrison & Foerster

(57) ABSTRACT

The vacuum processing apparatus of the present invention comprises a process chamber in which predetermined processing is performed on a target object in a predetermined vacuum condition, a mount stage provided in the process chamber, for mounting thereon the target object, a shower head provided so as to oppose to the mount stage, for supplying a process gas in the process chamber, an exhaust path provided in a housing forming the process chamber, and extending so as to surround the mount stage outside the mount stage, an exhaust port formed around the mount stage, for connecting the exhaust path with the process chamber, a porous member provided at the exhaust port so as to partition the exhaust path and the process chamber from each other, and having a plurality of ventilation holes for making the exhaust path communicating with the process chamber, branching means for branching a gas flowing from the process chamber through the ventilation holes of the porous member, into a plurality of directions, such that the gas flows to the exhaust path, a plurality of upper exhaust pipes extending in an upper side of the process chamber and communicating with the exhaust path, and a lower exhaust pipe extending toward a lower side of the process chamber and communicating with all the upper exhaust pipes.

20 Claims, 11 Drawing Sheets

U.S. PATENT DOCUMENTS

| | | | |
|---|---|---|---|
| 4,042,971 | 8/1977 | Brennecke et al. | 361/213 |
| 4,333,123 | 6/1982 | Moulden | 361/213 |
| 4,340,462 | 7/1982 | Koch | 204/298.35 |
| 4,459,267 | 7/1984 | Bunce et al. | 73/864.11 |
| 4,523,985 | 6/1985 | Dimock | 204/298.25 |
| 4,553,069 | 11/1985 | Purser | 315/111.81 |
| 4,643,629 | 2/1987 | Takahashi et al. | 204/298.25 |
| 4,675,530 | 6/1987 | Rose et al. | 250/492.2 |
| 4,724,222 | 2/1988 | Feldman | 250/492.2 |
| 4,786,814 | 11/1988 | Kolondra et al. | 250/492.2 |
| 4,789,564 | 12/1988 | Kanner et al. | 427/255.6 |
| 4,797,054 | 1/1989 | Arii | 414/217 |
| 4,804,837 | 2/1989 | Farley | 250/251 |
| 4,870,923 | 10/1989 | Sugimoto | 118/715 |
| 4,892,615 | 1/1990 | Motta | 156/345 |
| 4,924,800 | 5/1990 | Tanaka | 118/50.1 |
| 4,982,138 | 1/1991 | Fujiwara et al. | 118/723 MR |
| 4,990,047 | 2/1991 | Wagner et al. | 414/217 |
| 5,070,814 | 12/1991 | Whiffin et al. | 118/715 |
| 5,080,549 | 1/1992 | Goodwin et al. | 414/744.8 |
| 5,084,125 * | 1/1992 | Aoi | 156/345 |
| 5,099,557 | 3/1992 | Engelsberg | 29/25.01 |
| 5,110,248 | 5/1992 | Asano et al. | 118/719 |
| 5,155,652 | 10/1992 | Logan et al. | 361/234 |
| 5,181,819 | 1/1993 | Sakata et al. | 414/217 |
| 5,203,925 | 4/1993 | Shibuya et al. | 118/725 |
| 5,209,803 * | 5/1993 | Powell | 118/723 R |
| 5,221,201 | 6/1993 | Yamaga et al. | 432/241 |
| 5,252,134 | 10/1993 | Stauffer | 118/715 |
| 5,254,229 | 10/1993 | Ohmi et al. | 204/157.15 |
| 5,273,423 | 12/1993 | Shiraiwa | 432/241 |
| 5,275,683 | 1/1994 | Arami et al. | 156/345 |
| 5,277,579 | 1/1994 | Takanabe | 432/5 |
| 5,278,138 | 1/1994 | Ott et al. | 427/126.3 |
| 5,286,978 | 2/1994 | Yoshida et al. | 250/492.21 |
| 5,303,671 | 4/1994 | Kondo et al. | 156/345 |
| 5,306,921 | 4/1994 | Tanaka | 250/492.21 |
| 5,316,970 | 5/1994 | Batchelder et al. | 250/424 |
| 5,376,224 * | 12/1994 | Zarowin | 156/345 |
| 5,383,970 | 1/1995 | Asaba et al. | 118/715 |
| 5,462,397 | 10/1995 | Iwabuchi et al. | 118/719 |
| 5,492,862 | 2/1996 | Misumi et al. | 438/516 |
| 5,501,870 | 3/1996 | Shiraishi et al. | 427/8 |
| 5,591,269 | 1/1997 | Arami et al. | 118/723 R |
| 5,676,757 | 10/1997 | Ikeda et al. | 118/733 |
| 5,681,614 | 10/1997 | Omori et al. | 427/248.1 |

* cited by examiner

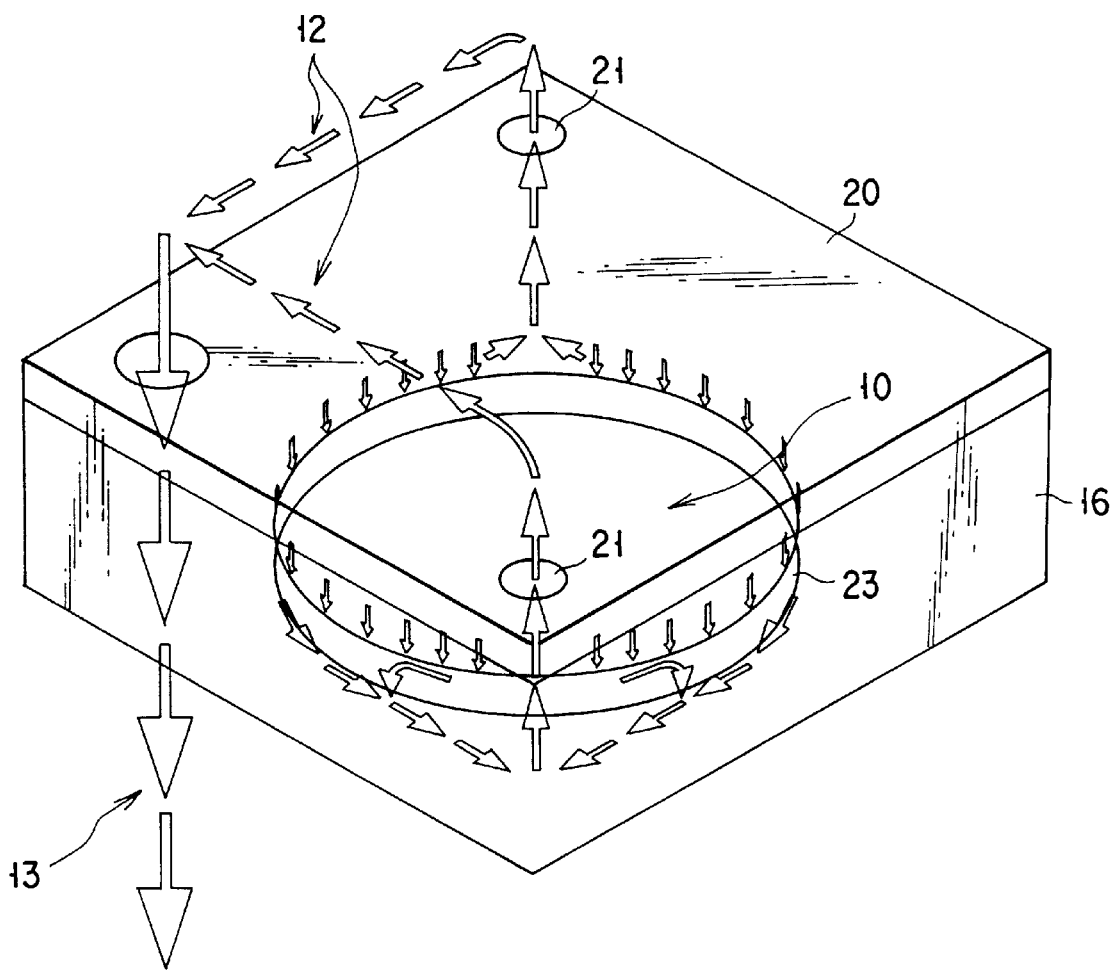
F I G. 5

VACUUM PROCESSING APPARATUS

BACKGROUND OF THE INVENTION

The present invention relates to a vacuum processing apparatus for making predetermined processing on a target object such as a LCD (Liquid Crystal Display) substrate, a semiconductor wafer, or the like.

In general, a vacuum processing apparatus for performing predetermined processing (such as etching or the like) on a target object such as a LCD substrate, a semiconductor wafer, or the like comprises a load lock chamber provided with a transfer arm, and a process chamber provided adjacent to the load lock chamber. Each of the chambers is set to be a predetermined vacuum condition. A target object set in the load lock chamber is transferred into the process chamber by the transfer arm, and predetermined processing is performed thereon in the process transferred. Upon completion of processing in the process chamber by the transfer arm, the target object is returned to the load lock chamber by the transfer arm.

FIG. 11 shows a conventional vacuum processing apparatus. As shown in the figure, the vacuum processing apparatus comprises a process chamber (b).

A mount stage (susceptor) (i) as a lower electrode where a semiconductor wafer W as a target object to be processed is mounted on the bottom portion of the process chamber (b). A lamp unit (p) for heating the wafer W through the mount stage (i) is provided under the mount stage (i). The lamp unit (p) comprises a plurality of halogen lamps (j) which are used as a heat source to heat the wafer W.

Above the mount stage (i), a shower head (c) as an upper electrode is provided opposing to the mount stage (i). The shower head (c) comprises a head body (e) and a porous disk (d) fixed to the head body (e) by screws (f). The shower head (c) diffuses a process gas supplied to the head body (e) through a gas supply pipe (a) from a process gas supply source to supply the gas uniformly over the wafer W mounted on the mount stage (i). When forming a film on the wafer W on the mount stage (i) by a process gas supplied through the shower head (c), for example, a high-frequency voltage is applied to the shower head (c) from a high-frequency power source so that a plasma is generated at a process space between the shower head (c) and the mount stage (i).

An exhaust path (h) is provided around the process chamber (b). An porous plate (g) used for exhaustion and provided so as to surround the mount stage (i) separates the process chamber (b) and the exhaust path (h) from each other. Four exhaust pipes (k) are connected to the exhaust path (h). The four exhaust pipes (k) are arranged at intervals of 90° along the circumferential direction of the exhaust path (h) and are connected together to a forced exhaust pipe (m) provided under the process chamber (b). Therefore, the gas in the process chamber (b) flows to the exhaust path (h) through the porous plate (g) for exhaustion and is forcibly exhausted from the forced exhaust pipe (m) through the four exhaust pipes (k). If four exhaust pipes (k) are thus provided around the mount stage (i), the gas in the processing chamber (b) can be uniformly exhausted.

If four exhaust pipes (k) are arranged so as to surround the lamp unit (p) as shown in FIG. 11, there is a drawback that maintenance of the lamp unit (p) (and particularly a periodical service of replacing the halogen lamps (j)) is obstructed by the four exhaust pipes (k) and the entire apparatus is enlarged.

Meanwhile, in order to supply the process gas uniformly over the wafer W, the distance between the mount stage (i) and the porous disk (d) must be set to be small as much as possible. However, a transfer arm for transferring a wafer W into and out of the process chamber (b) comes in and out through the space between the mount stage (i) and the porous disk (d). Also, the mount stage (i) is provided with a clamp ring for clamping a peripheral edge portion of the wafer W. Further, there is a limitation to downsizing of the transfer arm and the clamp ring (or reduction of the thickness of them). Therefore, the distance between the mount stage (i) and the porous disk (d) is generally set to 18 mm.

However, if the distance between the mount stage (i) and the porous disk (d) is set to 18 mm, a process gas supplied through the porous disk (d) escapes to the outer peripheral side of the process chamber so that the process gas is not applied uniformly onto the wafer W.

In relation to the problems described above, for example, U.S. Pat. No. 4,340,462 discloses a plasma processing apparatus capable of adjusting the distance between a shower head as an upper electrode and a mount stage as a lower electrode. However, in the apparatus disclosed in the U.S. Patent, the entire shower head moves up and down (e.g., the head body (e) and the porous disk (d) integrally move up and down). Therefore, the drive mechanism has a large size, and a sealing means provided between the shower head and the process chamber to seal the process chamber from the outside is enlarged (which means a large sealing area). Therefore, the leakage rate is high and a great deal of particles are generated.

BRIEF SUMMARY OF THE INVENTION

The present invention has a first object of providing a compact vacuum processing apparatus in which maintenance services for its lamp unit are not obstructed by exhaust pipes. Also, the present invention has a second object of providing a vacuum processing apparatus capable of improving uniformity of film formation without obstructing transportation of a target object into and from a process chamber.

The first objects of the present invention are achieved by a vacuum processing apparatus as follows. The vacuum processing apparatus comprises: a process chamber in which predetermined processing is performed on a target object in a predetermined vacuum condition; a mount stage provided in the process chamber, for mounting thereon the target object; a shower head provided so as to oppose to the mount stage, for supplying a process gas in the process chamber; an exhaust path provided in a housing forming the process chamber, and extending so as to surround the mount stage outside the mount stage; an exhaust port formed around the mount stage, for connecting the exhaust path with the process chamber; a porous member provided at the exhaust port so as to partition the exhaust path and the process chamber from each other, and having a plurality of ventilation holes for making the exhaust path communicating with the process chamber; branching means for branching a gas flowing from the process chamber through the ventilation holes of the porous member, into a plurality of directions, such that the gas flows to the exhaust path; a plurality of upper exhaust pipes extending in an upper side of the process chamber and communicating with the exhaust path; and a lower exhaust pipe extending toward a lower side of the process chamber and communicating with all the upper exhaust pipes.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments give below, serve to explain the principles of the invention.

FIG. 5 is a schematic view showing the flow of a gas through exhaust passages of the vacuum processing apparatus shown in FIG. 1A;

DETAILED DESCRIPTION OF THE INVENTION

In the following, an embodiment of the present invention will be explained with reference to the drawings.

Figure 1B:
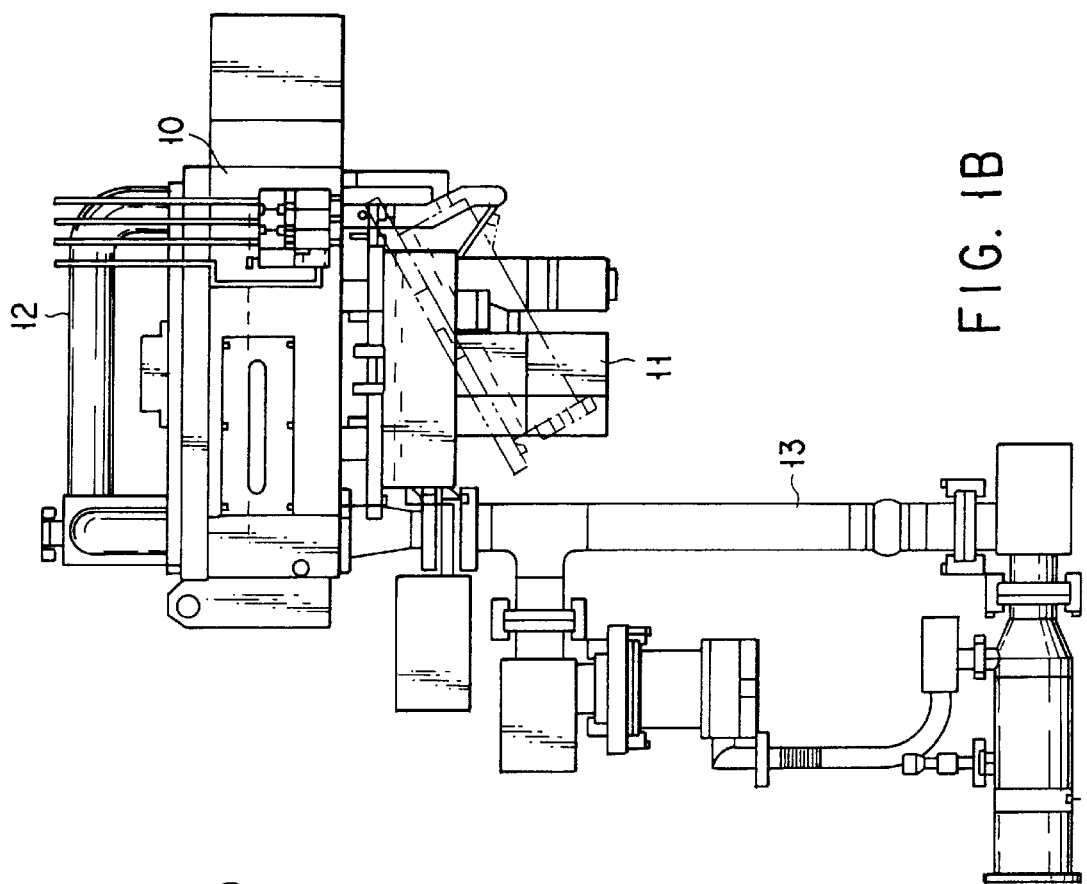
FIG. 1B is a side view showing the vacuum processing apparatus shown in FIG. 1A.
Figure 1A:
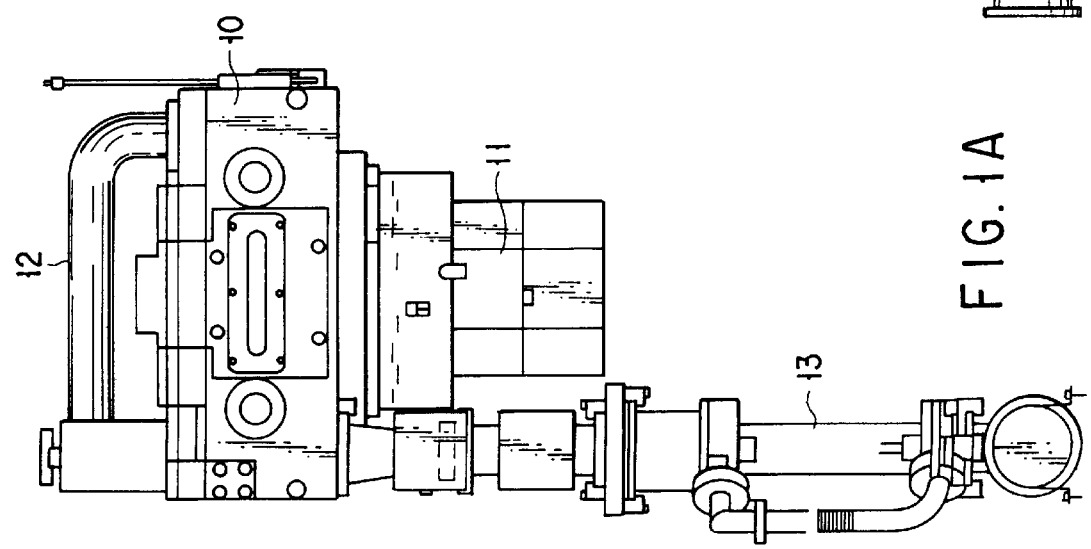
FIG. 1A is a front view showing a vacuum processing apparatus according to an embodiment of the present invention.

FIG. 1 shows a vacuum processing apparatus according to an embodiment of the present invention. In the figure, the reference 10 denotes a process chamber and a lamp unit 11 is provided below the process chamber 10. The lamp unit 11 can be rotated downward about a predetermined support axis for the purpose of maintenance services or the like, as indicated by a broken line in the figure. Two upper exhaust pipes 12 communicating with an exhaust path 18 described later are provided above the process chamber 10. A lower exhaust pipe 13 connected with the upper exhaust pipes 12 is provided under the process chamber 10. Note that the lower exhaust pipe 13 is located at a position where the pipe 13 it is kept away from the lamp unit, viewed from the front of the vacuum processing apparatus (in FIG. 1A), i.e., at the corner in the front right side of the process chamber 10.

Figure 2:
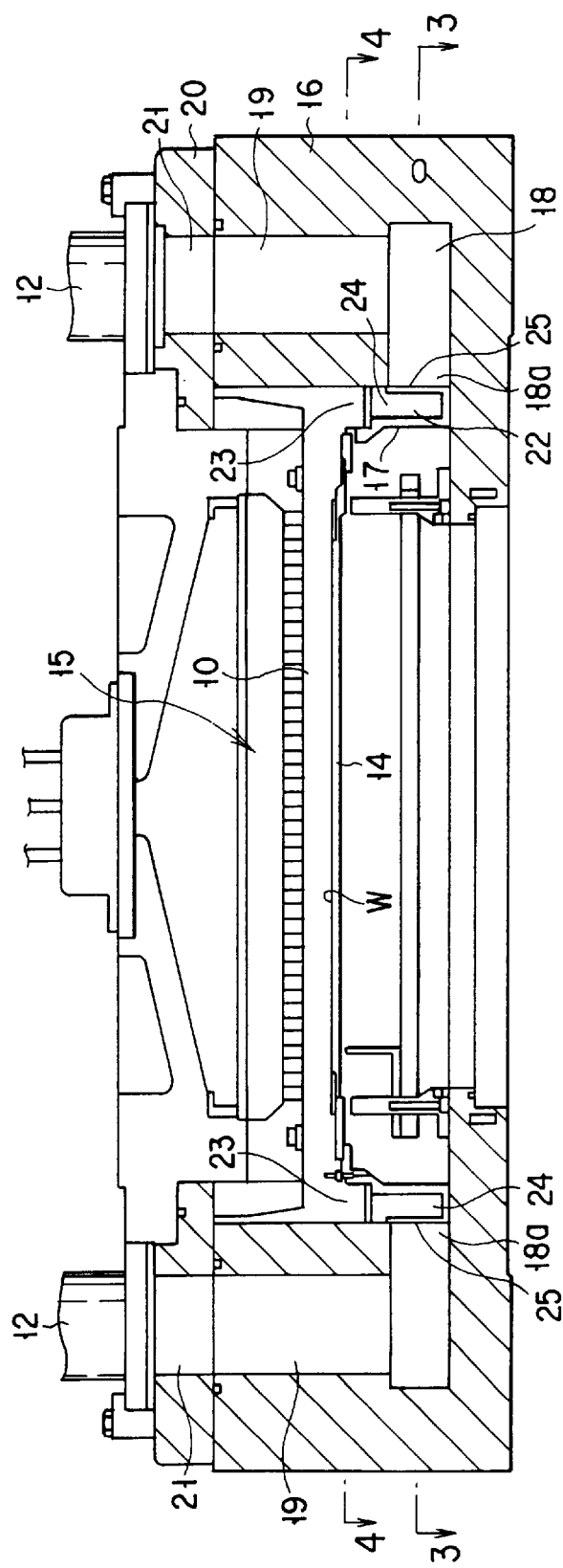
FIG. 2 is a longitudinal cross-sectional view showing the process chamber of the vacuum processing apparatus shown in FIG. 1A.

As shown in FIG. 2, a mount stage (susceptor) 14 where a semiconductor wafer W as a target object to be processed is mounted is provided under the process chamber 10. A shower head 15 is provided above the process chamber 10 so as to oppose to the mount stage 14. The periphery of the process chamber 10 is surrounded by a partition wall 16 so that the chamber 10 is constructed as a sealed container. A ring member 17 for supporting the outer periphery of the mount stage 14 is provided at the bottom portion of the partition wall 16.

The process chamber 10 is provided adjacent to a load lock chamber (not shown), and a wafer W held by the transfer arm (not shown) is transferred in one after another from the load lock chamber into the process chamber 10 through a gate valve (not shown) provided on the partition wall 16.

Figure 3:
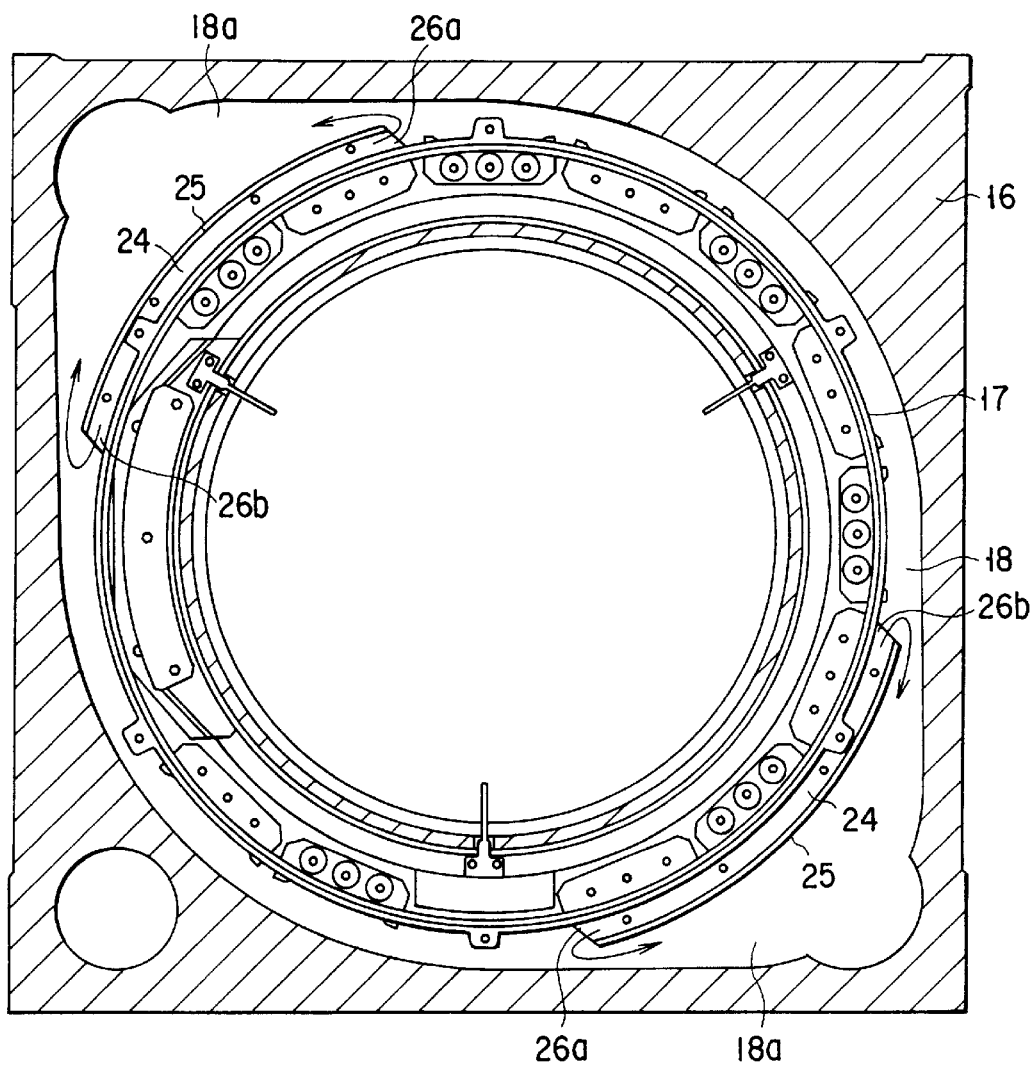
FIG. 3 is a cross-sectional view along the line 3—3 shown in FIG. 2.
Figure 4:
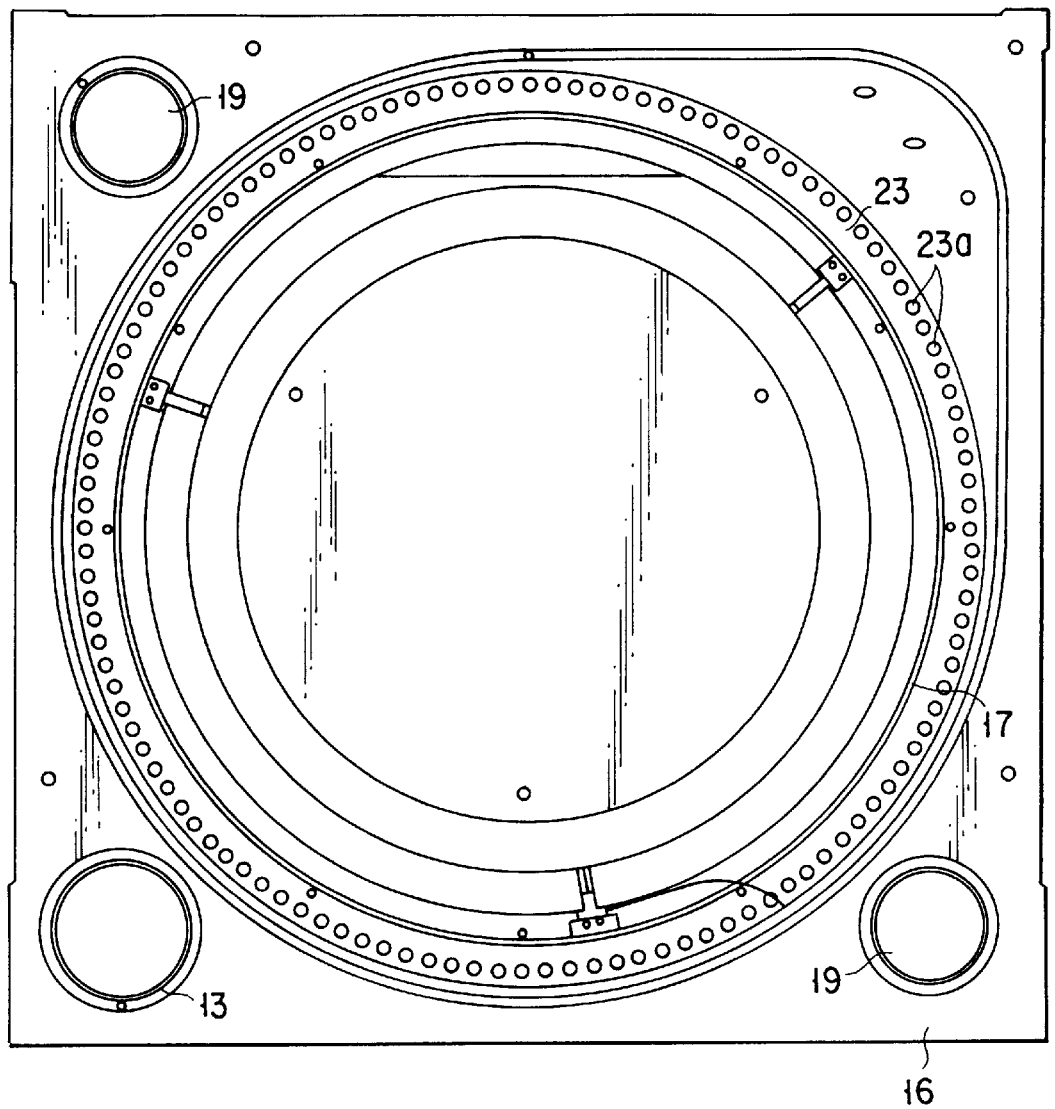
FIG. 4 is a cross-sectional view along the line 4—4 shown in FIG. 2.

As shown in FIGS. 3 and 4, the partition wall 16 is provided with a circular exhaust path 18 located so as to surround the outside of the ring member 17. Also, exhaust bores 19 communicating with the exhaust path 18 are provided at two positions of the partition wall 16 which are symmetrical to each other with respect to the mount stage 14. As shown in FIG. 2, the exhaust bores 19 extend upward in the partition wall 16 and are open at the upper end of the partition wall 16. The exhaust bores 19 respectively communicate with two exhaust pipe connection ports 21 provided in a base plate 20 supporting the shower head 15. The exhaust pipe connection ports 21 are respectively connected with ends of upper exhaust pipes 12. The other ends of the two upper exhaust pipes 12 are connected to be merged with an upper end portion of a lower exhaust pipe 13. The base plate 20 is fixed to the partition wall 16.

Between the outer circumferential surface of the ring member 17 and the partition wall 16, a clearance 22 (or exhaust port) is formed so as to surround the outer circumference of the mount stage 14 and connects the process chamber 10 with the exhaust path 18. The clearance 22 is provided with a ring-like exhaust porous plate 23 which partitions the process chamber 10 and the exhaust path 18 from each other. The exhaust porous plate 23 has a number of exhaust small-holes 23a, so that the gas in the process chamber 10 is exhausted to the exhaust path 18 through the exhaust small-holes 23a positioned at the outer circumference of the mount stage 14.

Communicating portions 18a of the exhaust path 18 communicating with the exhaust bores 19 spread like a sector as shown in FIG. 3, so that the gas in the exhaust path 18 flows smoothly to the exhaust bores 19. The communicating portions 18a of the exhaust path 18 are provided with baffle plates 25 positioned apart from the outer circumferential surface of the ring member 17 by a predetermined distance. These baffle plates 25 are formed like arcs along the curvature of the ring member 17, thereby forming branch exhaust passages 24 between the plates 25 and the ring member 17. Exhaust portions 26a and 26b are formed at both end portions of each branch exhaust passage 24. Therefore, a gas exhausted through the exhaust small-holes 23a of the exhaust porous plate 23 is not directly guided to the exhaust bores 19 but flows to the left and right exhaust portions 26a and 26b through the branch exhaust passages 24 formed by the baffle plates 25. The gas is exhausted from the exhaust portions 26a and 26b to the exhaust path 18. Specifically, the gas in the process chamber 10 is uniformly exhausted from the outer circumference of the mount stage 14 substantially through total four exhaust portions 26a and 26b (two of which are provided for each of two branch exhaust passages 24). The distance between the exhaust portions 26a and 26b can be adjusted by adjusting the length of the baffle plates 25.

Figure 6:
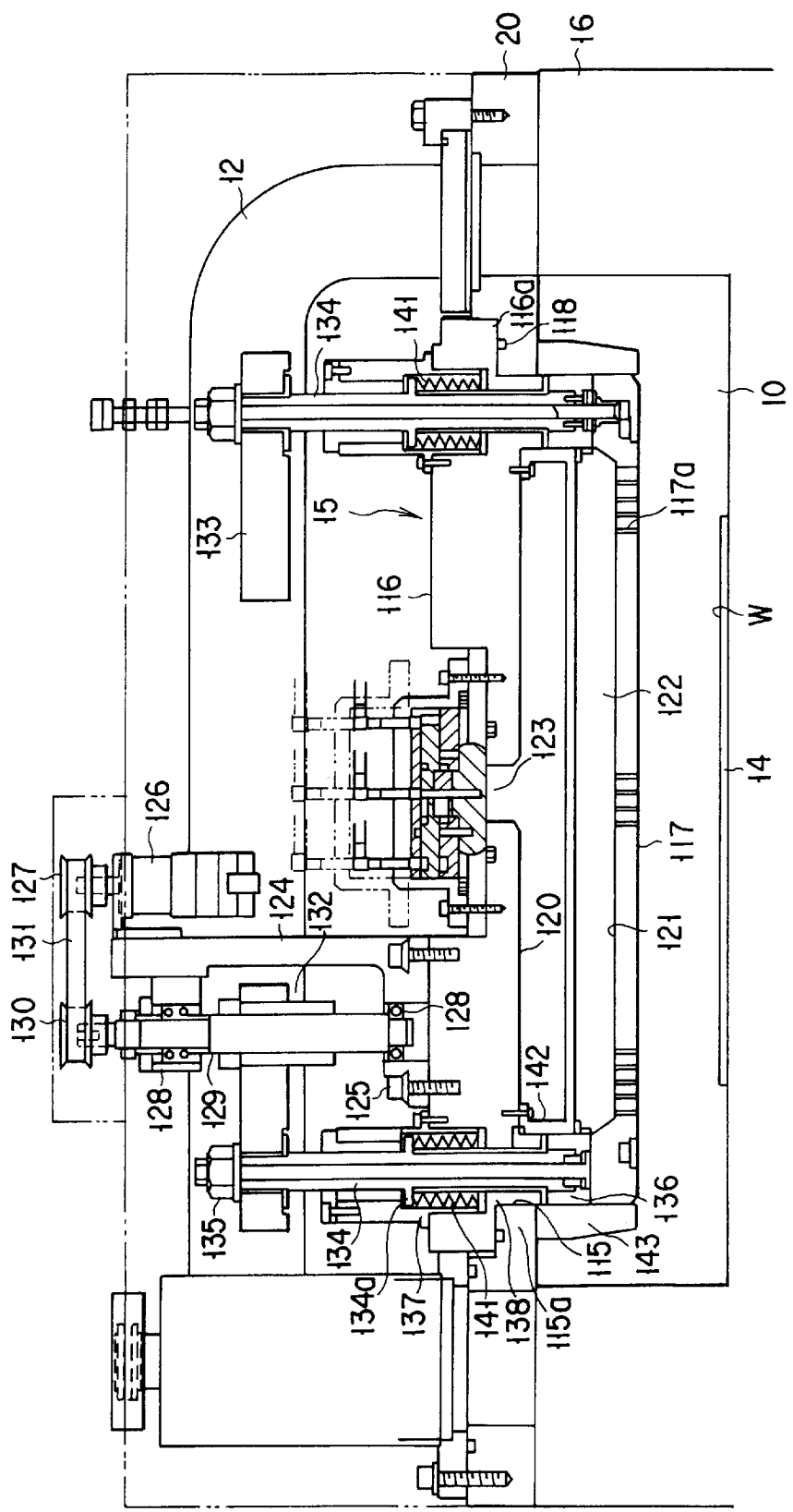
FIG. 6 is a view showing the structure of the shower head and its elevation mechanism thereof of the vacuum processing apparatus shown in FIG. 1A (where the porous disk is moved up)
Figure 9:
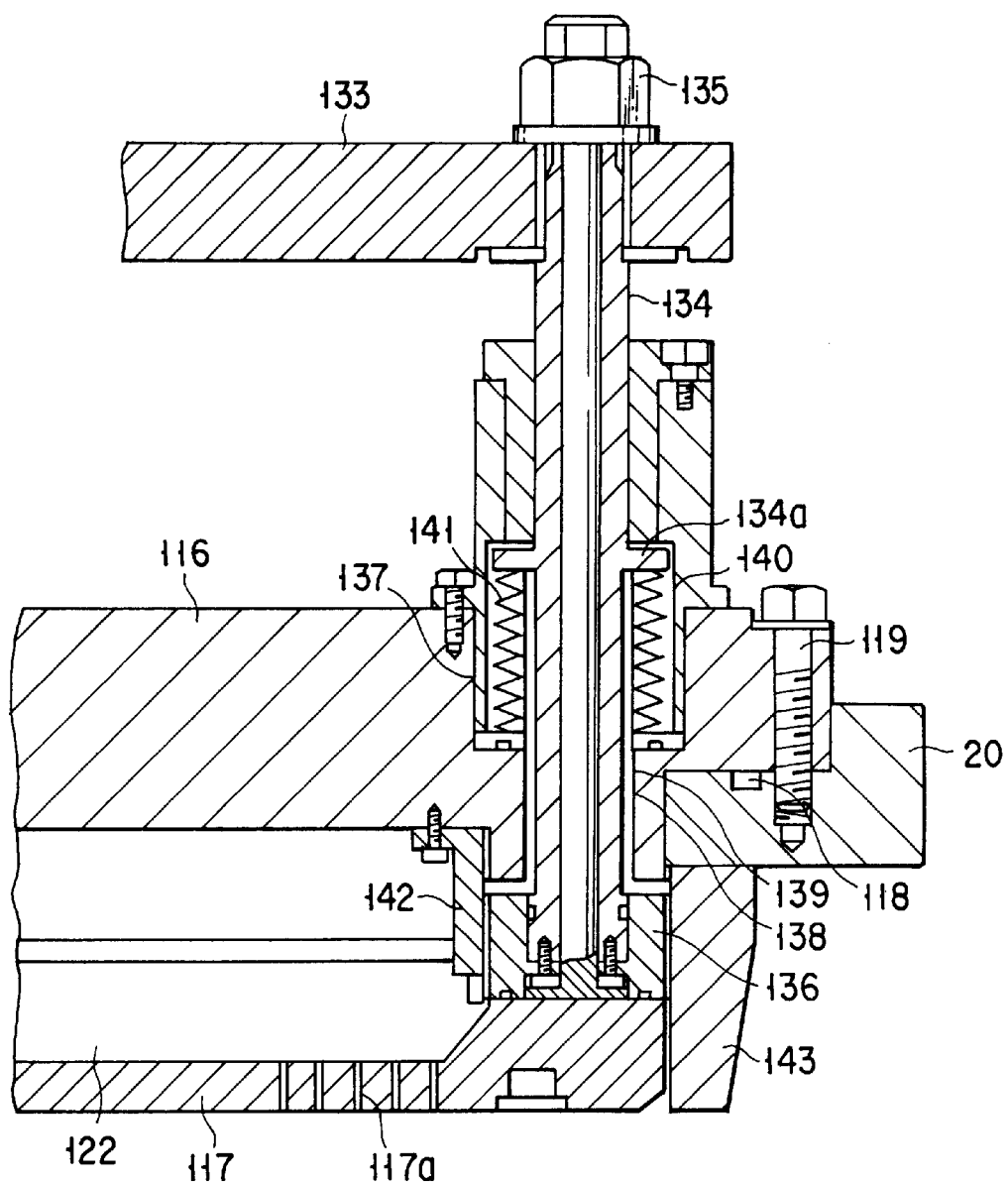
FIG. 9 is an enlarged cross-sectional view showing a part of the elevation mechanism of the shower head.

As shown in FIG. 6, a hole 115 having a circular cross section is provided in the base plate 20 fixed to the partition wall 16 and has a gap portion 115a on its inner circumference. The base plate 20 supports the shower head 15 by the hole 115. The shower head 15 comprises a head body 116 formed like a disk, and a porous disk 117 which is arranged to be elevated up and down with respect to the head body 116 and has a number of gas injection holes 117a in its plate surface. The outer circumferential portion of the head body 116 is provided with a gap portion 116a to be engaged with the gap portion 115a of the base plate 20. An O-ring 118 for sealing is provided at the joining surfaces of the gap portions 115a and 116a. In order to hold air-tightly the head body 116 on the base plate 20, the head body 116 is fixed to the base plate 20 by a plurality of fixing screws 119 outside the O-ring 118, as shown in FIG. 9.

As shown in FIG. 6, a diffusion chamber 122 is formed inside the shower head 15 by a concave portion 120 provided at the lower surface of the head body 116 and by a concave portion 121 provided at the upper surface of the porous disk 117 so as to oppose to the concave portion 120. The diffusion chamber 122 communicates with a process gas supply port 123 provided at the center portion of the head body 116. The process gas supply port 123 communicates with a process gas supply source (not shown) through a gas supply pipe.

A motor support member 124 is fixed to the upper surface of the head body 116 by fixing screws 125. A stepping motor 126 is vertically attached to an upper portion of a side surface of the motor support member 124, with the rotation shaft of the motor oriented upward. In addition, the rotation shaft of the stepping motor 126 is engaged with a pulley 127. Bearings 128 are respectively provided at upper and lower portions of the other side surface of the motor support member 124, which opposes to the stepping motor 126. Both end portions of a screw rod 129 are rotatably supported on the bearings 128. The upper end of a screw rod 129 is engaged with a pulley 130 and a timing belt 131 is tensioned between the pulleys 130 and 127. Therefore, the torque of the stepping motor 126 is transmitted to the screw rod 129 through the timing belt 131.

A nut 132 is screwed on a screw portion of the screw rod 129. The nut 132 is fixed to a part of an elevation ring 133 which can be elevated up and down above the head body 116. The elevation ring 133 has an outer diameter substantially equal to the outer diameter of the head body 116 and is elevated up and down, kept in parallel to the head body 116 by regularly and inversely rotating the screw rod 129.

A plurality of elevation shafts 134 (four shafts in the present embodiment) are fixed to the elevation ring 133. Each elevation shaft 134 has a tubular shape so that a cooling water passage is formed along the lengthwise direction of the shaft. Each elevation shaft has a screw portion at its upper end portion, and the screw portions are screwed into the elevation ring 133 and nuts 135. The lower end portion of each elevation shaft 134 penetrates through the head body 116 and projects downward from the lower surface of the head body 116.

Figure 10:
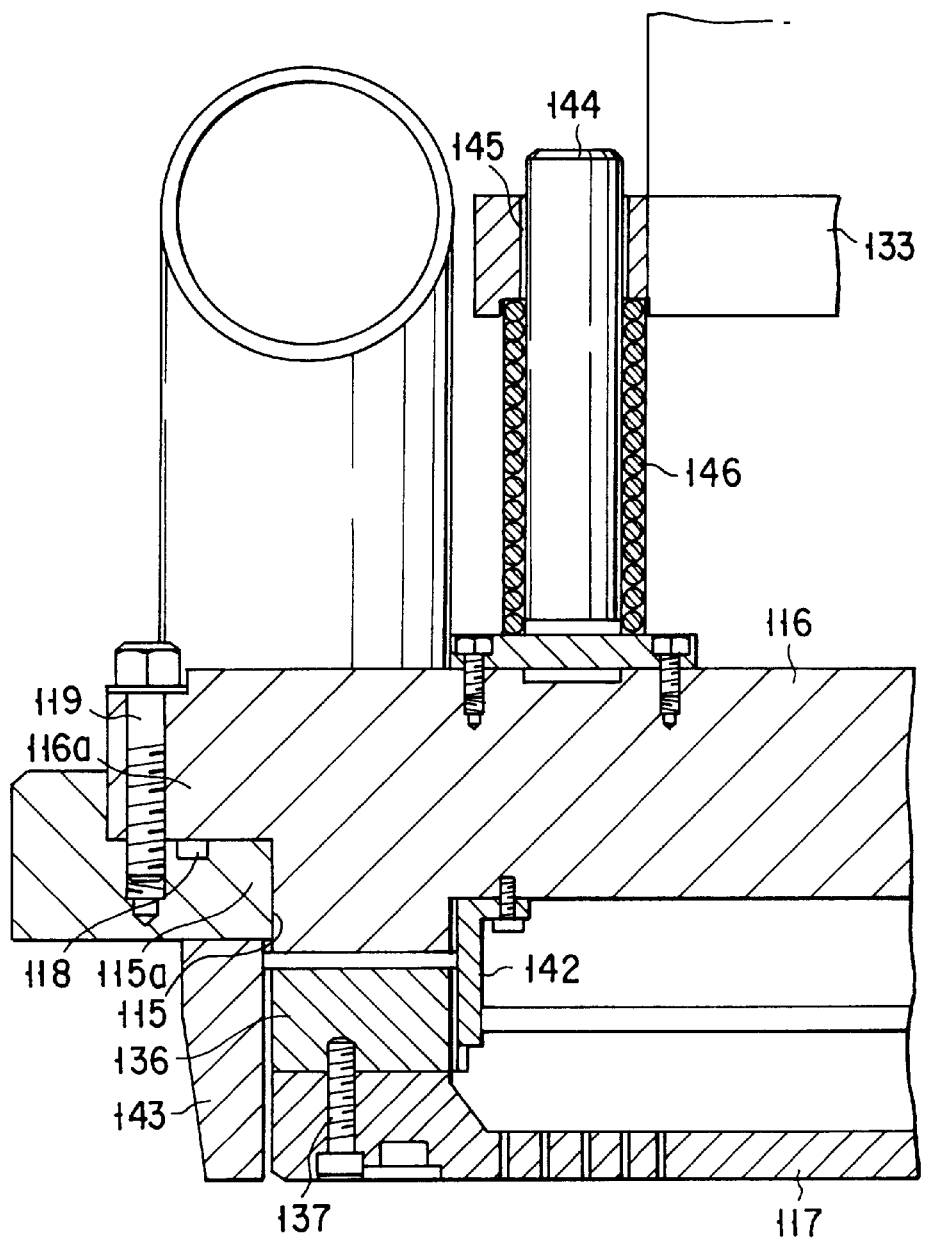
FIG. 10 is an enlarged cross-sectional view showing a part of the elevation mechanism of the shower head.
Figure 11:
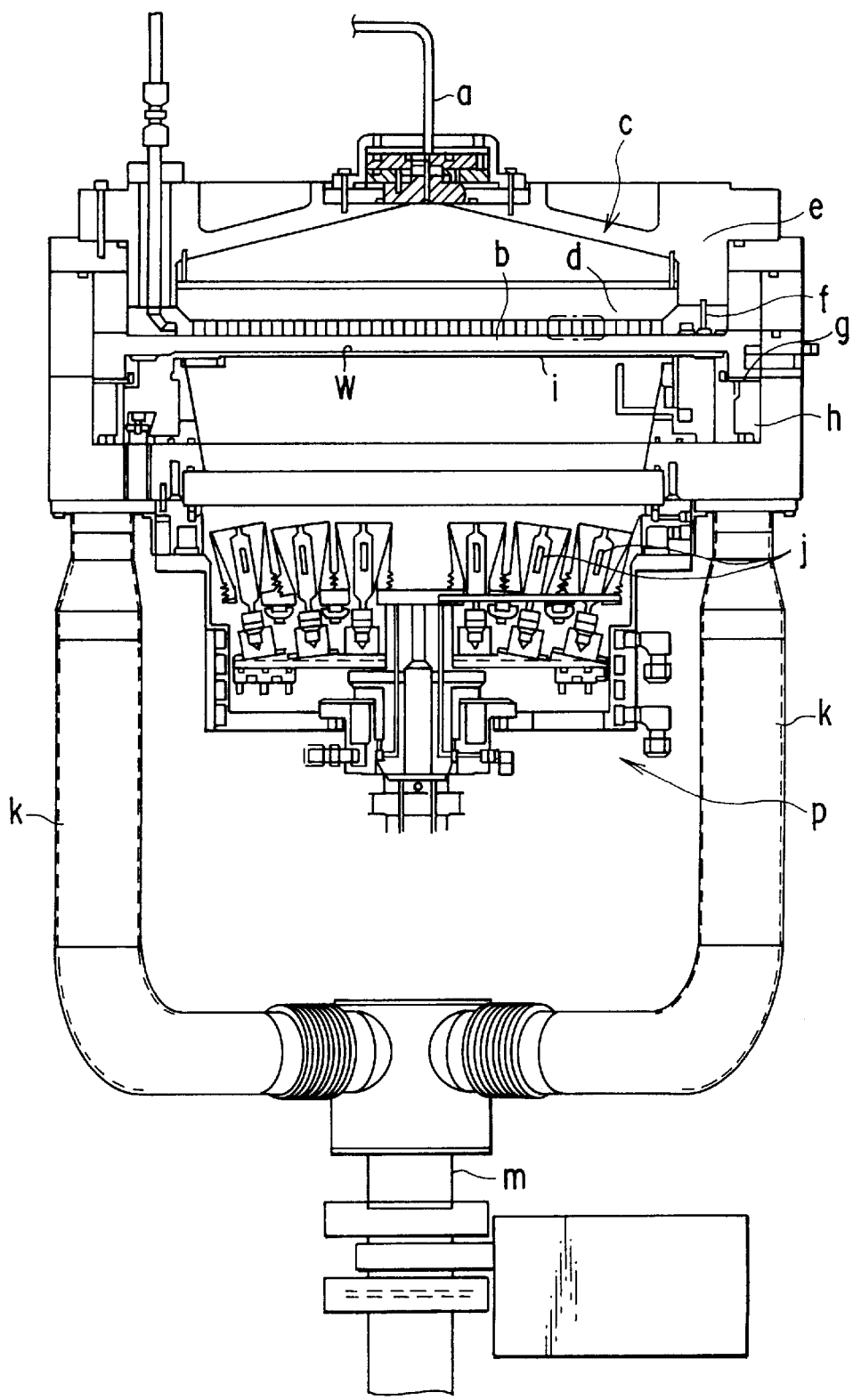
FIG. 11 is a view schematically showing a conventional vacuum processing apparatus.

A fixing ring 136 is fixed to the lower end portion of each elevation shaft 134, and the fixing ring 136 is arranged to have an outer diameter substantially equal to the outer diameter of the porous disk 117. As shown in FIG. 10, the porous disk 117 is fixed to the lower surface of the fixing ring 136 by screws 137. By loosening the screws 137, the porous disk 117 can be detached from the fixing ring 136.

Therefore, according to the structure as described above, when the elevation ring 133 is elevated down by the stepping motor 126, four elevation shafts 134 are simultaneously moved down, and, rather than the entire shower head 15, only the porous disk 117 fixed to the lower end portions of the elevation shafts 134 by the fixing ring 136 is moved down, kept in parallel. Inversely, when the elevation ring 133 is moved up, four elevation shafts 134 are simultaneously moved up, and, rather than the entire shower head 15, only the porous disk 117 is moved up, kept in parallel. In the present embodiment, the elevation stroke of the porous disk 117 is 15 mm, and the porous disk 117 can be moved to a position close to a position which is distant by 3 mm from the mount stage 14 from a position which is distant by 18 mm from the mount stage 14.

Figure 8:
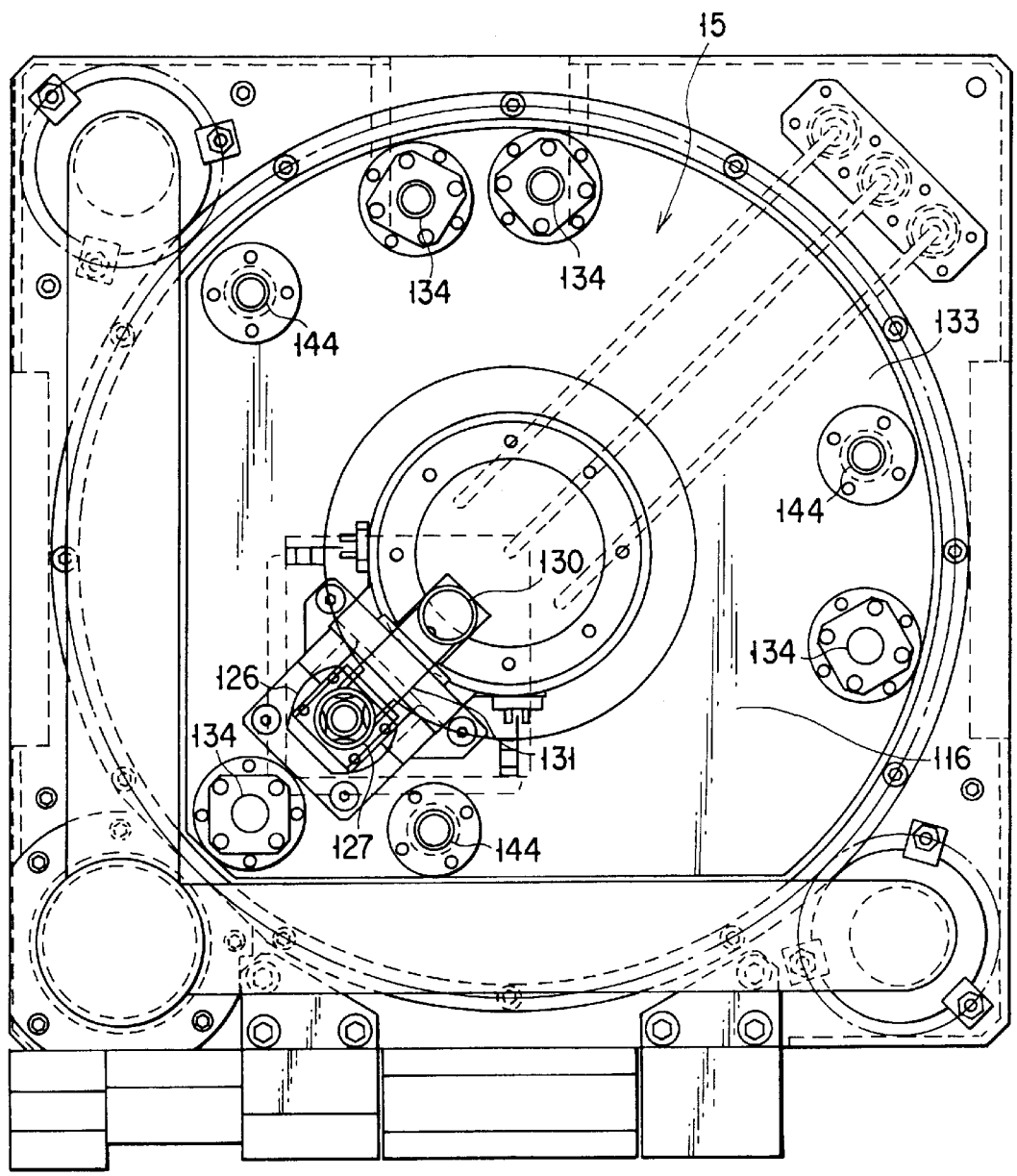
FIG. 8 is a plan view showing the shower head.

As shown in FIGS. 8 and 10, three rods 144 vertically project from the upper surface of the head body 116. The rods 144 are located so as to avoid four elevation shafts 134. The upper end portions of the rods 144 project upward, penetrating thorough engaging holes 145 formed in the elevation ring 133. A coil spring 146 is engaged with the outer circumference of each rod 144. The coil springs 146 are compressed and inserted between the upper surface of the head body 116 and the elevation ring 133, energizing the elevation ring 133 in a direction in which the elevation ring 133 is pushed upward.

As shown in FIG. 9, each elevation shaft 134 penetrates through one of four gapped holes formed in the head body 116. Each gapped hole consists of a large-diameter through hole 137 and a small-diameter through hole 138. The inner diameter of the small-diameter through hole 138 is set to be slightly larger than the outer diameter of the elevation shaft 134. As a result, a small clearance 139 is formed between the small-diameter through hole 138 and the elevation shaft 134. The inner diameter of the large-diameter through hole 137 is sufficiently larger than the outer diameter of the elevation shaft 134. As a result, a large clearance 140 is formed between the large-diameter through hole 137 and the elevation shaft 134. A bellows 141 to be engaged with the outer circumference of the elevation shaft 134 is located in the large clearance 140. The bellows 141 has a lower edge air-tightly sealed and fixed to the bottom portion of the large-diameter through hole 137, and an upper edge air-tightly sealed and fixed to a flange 134a integrally provided in the middle of the elevation shaft 134. In this structure, the inside of the bellows 141 communicates with the diffusion chamber 122 through the small clearance 139 and is kept in a vacuum condition. Meanwhile, the outside of the bellows 141 communicates with the outside of the head body 116 and is kept at an atmospheric pressure. Thus, the diffusion chamber 122 (process chamber 10) is shielded from the outside kept at the atmospheric pressure by the bellows 141 provided at four positions, so that the leakage rate is reduced.

As shown in FIG. 9, an inner ring 142 is fixed near the outer circumferential portion of the lower surface of the head body 116, inside the fixing ring 136. In addition, an outer ring 143 is provided on the lower surface of the base plate 20, outside the fixing ring 136. These rings 142 and 143 form an engaging portion which covers the inner and outer sides of the fixing ring 136. A clearance is formed between the fixing ring 136 and the inner ring 142 and also between the fixing ring 136 and the outer ring 143, so that the fixing ring 136 might not move up or down in contact with the inner ring 142 and the outer ring 143 thereby creating particles when the porous disk 117 is elevated up or down.

Next, explanation will be made of operation of the vacuum processing apparatus constructed in the structure as described above.

When the inside of the process chamber 10 is set in a predetermined vacuum condition, a wafer W is transferred into the process chamber 10 from the load lock chamber by the transfer arm and is mounted on the mount stage 14 provided at the bottom portion of the process chamber 10. In this time, the porous disk 117 of the shower head 15 is maintained at an upper position distant by 18 mm from the mount stage 14, as shown in FIG. 6. Therefore, when transferring the wafer W into the process chamber 10 by the transfer arm, the transfer arm or the wafer W does not interfere with the clamp ring and the like and the wafer can be transferred in without a trouble. The wafer W on the mount stage 14 is thereafter heated from its lower side by the lamp unit 11.

Once the wafer W is mounted on the mount stage 14 and fixed by the clamp ring, the stepping motor 126 is rotated in its regular direction. The torque of the motor 126 is transmitted to the screw rod 129 through the pulley 127, the timing belt 131, and the pulley 130 in this order, thereby rotating the screw rod 129. The rotation movement of the screw rod 129 is converted into linear movement by the nut 132 engaged with the screw rod 129, thereby move down the elevation ring 133. In this time, the elevation ring 133 is supported by four elevation shafts 134, and therefore moves down kept in parallel to the head body 116. Simultaneously, the coil springs 146 are compressed as the elevation ring 133 moves down.

As the elevation ring 133 moves down, four elevation shafts 134 fixed to the ring are simultaneously moved down so that the porous disk 117 is moved close to the wafer W by the fixing ring 136. In this time, the bellows 141 are compressed by the flanges 134a of the elevation shafts 134. Also, in this time, the fixing ring 136 moves down without making contact with the inner ring 142 or the outer ring 143, so that particles are not created. This is because clearances are respectively formed between the fixing ring 136 and the inner ring 142 and between the fixing ring 136 and the outer ring 143.

Figure 7:
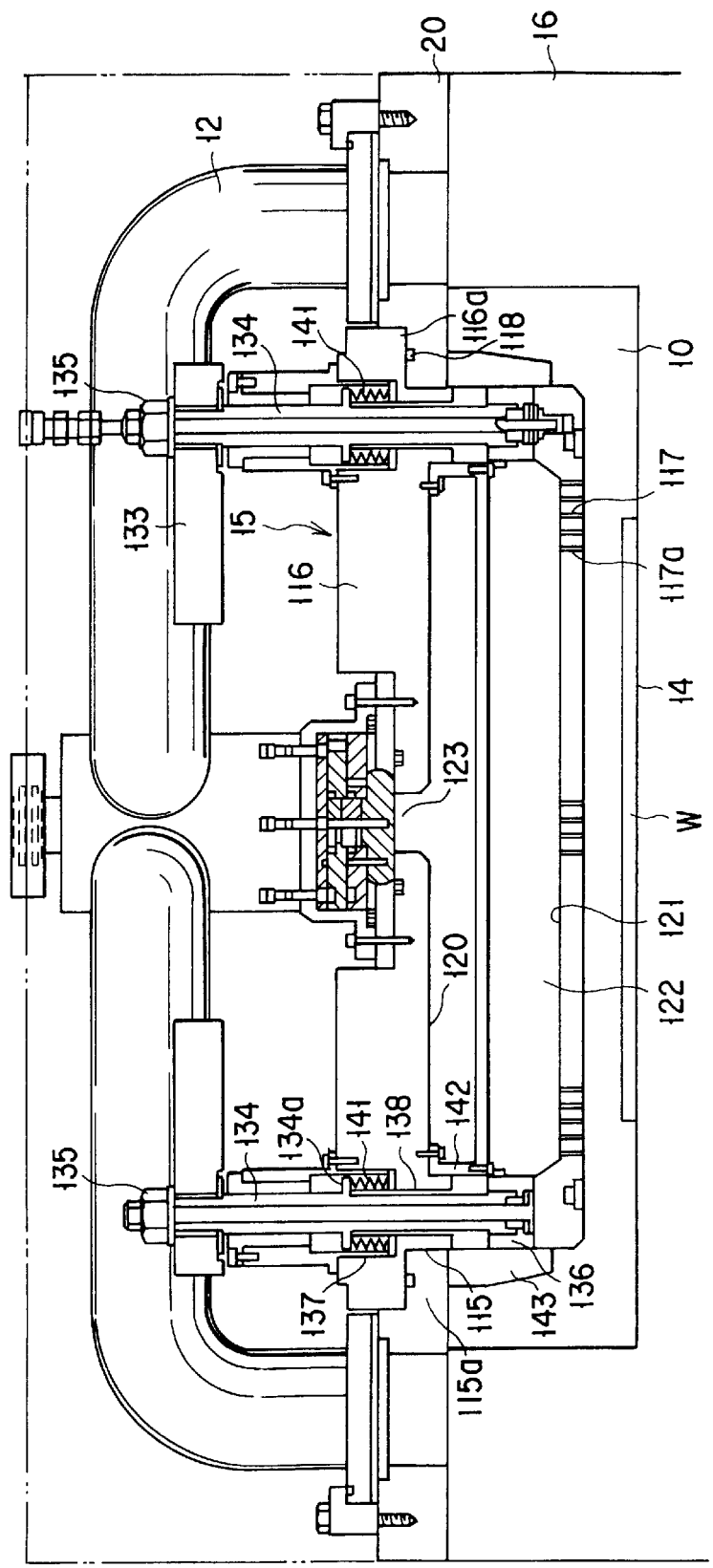
FIG. 7 is a view showing the structure of the shower head and its elevation mechanism thereof of the vacuum processing apparatus shown in FIG. 1A (where the porous disk is moved down)

When the downward movement of the porous disk 117 reaches a predetermined value, e.g., 10 mm, the stepping motor 126 is stopped and the elevation ring 133 stops moving down. Therefore, downward movement of the porous disk 117 is stopped, and as shown in FIG. 7, the porous disk 117 is kept close to the wafer W. In this state, a process gas from the process gas supply source is supplied into the diffusion chamber 122 through the process gas supply port 123, and then, the process gas diffused by the diffusion chamber 122 is injected to the wafer W through a number of gas injection nozzles 117a. In this case, since the porous disk 117 is positioned close to the wafer W, the process gas is uniformly supplied to the entire surface of the wafer W. Accordingly, the film formation speed and the film formation uniformity are improved in comparison with a conventional apparatus, so that the processing efficiency is improved.

Upon completion of the processing on the wafer W, the process gas in the processing chamber 10 is forcibly exhausted. In the following, explanation will be made of exhaustion of the gas in the process chamber 10.

Since the one lower exhaust pipe 13 provided under the process chamber 10 is connected to a forcible exhaustion source, the inside of the process chamber 10 is rendered negative and the gas in the process chamber 10 is exhausted to the exhaust path 18 through the exhaust small holes 23a of the exhaust porous plate 23 provided around the outer circumference of the wafer W. In this case, the gas exhausted through the exhaust small holes 23a is not directly discharged to the exhaust path 18 but once flows into the branch exhaust passages 24 constructed by the baffle plates 25 and is thereby branched to the left and right sides of each of the passages 24. Thereafter, the gas is exhausted to the exhaust path 18 from the exhaust portions 26a and 26b. That is, the gas is substantially exhausted through four portions. It is therefore possible to exhaust uniformly the gas through the outer circumference of the mount stage 14.

The gas exhausted to the exhaust path 18 flows to the upper exhaust pipes 12 through the exhaust bores 19 provided at two positions. The flows of the gas from the upper exhaust pipes 12 are merged into the one lower exhaust pipe 13 and then exhausted to the outside. Thus, the gas flows around the upper portion of the process chamber 10 and is exhausted below the process chamber 10 (see FIG. 5).

Apart from the exhaustion of the gas described above, the stepping motor 126 is driven again to rotate inversely upon completion of processing on the wafer W. The torque of the motor 126 is transmitted to the screw rod 129 through the pulley 127, the timing belt 131, and the pulley 130 in this order, thereby rotating the screw rod 129. The rotation movement of the screw rod 129 is converted into linear movement by the nut 132 engaged with the screw rod 129, thereby moving up the elevation ring 133.

As the elevation ring 133 moves up, four elevation shafts 134 fixed to the ring 133 are simultaneously moved up and the porous disk 117 is moved up and apart from the wafer W by the fixing ring 136. In this time, the fixing ring 136 moves up without making contact with the inner ring 142 or the outer ring 143, so that particles are not created.

When the upward movement of the porous disk 117 reaches a predetermined value, e.g., 18 mm, the stepping motor 126 is stopped so that the elevation ring 133 stops moving up. Therefore, the porous disk 117 stops moving up, and as shown in FIG. 6, the porous disk 117 is kept apart from the wafer W. In this state, a space which is sufficiently large and does not obstruct transportation of the wafer W by the transfer arm is securely maintained between the mount stage 14 and the porous disk 117. Therefore, the transfer arm or the wafer W does not interfere with the clamp ring or the like.

As has been explained above, in the vacuum processing apparatus according to the present embodiment, only one lower exhaust pipe 13 is provided under the process chamber 10, at a position kept away from the lamp unit 11. Therefore, the lower exhaust pipe 13 does not obstruct maintenance services for the lamp unit 11, but services of replacing halogen lamps and the like can be carried out easily. In addition, the apparatus itself is more compact in comparison with a conventional structure in which four exhaust pipes are located surrounding a lamp unit. In the vacuum processing apparatus according to the present embodiment, only two upper exhaust pipes 12 are provided above the process chamber 10. Therefore, the upper exhaust pipes 12 do not obstruct maintenance services for the elevation mechanism of the porous disk 117 of the shower head 15, but maintenance services for the elevation mechanism can be carried out easily. Further, in the vacuum processing apparatus according to the present embodiment, the exhaust system is constructed such that the gas in the process chamber is exhausted from symmetrical four positions around the mount stage 14. Therefore, the gas in the process chamber 10 can be exhausted uniformly from the periphery of the mount stage 14.

Also, in the vacuum processing apparatus according to the present embodiment, the distance between the porous disk 117 of the shower head 15 and the mount stage 14 can be adjusted. Therefore, when a wafer W is transferred into and out of the process chamber 10 by the transfer arm, the porous disk 117 is situated apart from the mount stage 14, so that the space between the mount stage 14 and the porous disk 117 is maintained to be large enough to transfer in and out the wafer W without problems. In addition, when the wafer W is processed, the porous disk 117 is situated close to the mount stage 14 so that the process gas is uniformly supplied over the entire surface of the wafer W.

Also, in the vacuum processing apparatus according to the present embodiment, the entire shower head 15 does not move up and down (or the head body 16 and the porous disk 17 integrally move up and down) unlike in a conventional apparatus, but only the porous disk 117 moves up and down. In addition, the porous disk 117 is moved up and down only by four elevation shafts 134. Therefore, only the driving parts of the elevation shafts 134 need to be provided with sealing means to be provided between the shower head 15 and the process chamber 10 for the purpose of sealing the process chamber 10 from the outside. As a result of this, the sealing area is reduced and the leakage rate is thereby reduced. Accordingly, generation of particles can be reduced.

Although the screw rod 129 is rotated by the stepping motor 126 in the present embodiment, the structure of the drive source and the power transmission system for rotating the rod 129 are not limited to the structure described in the present embodiment. Also, in the present embodiment, the baffle plates 25 are separately provided at the outer circumference of the ring member 17. However, the ring member 17 and the baffle plates 25 may be formed integrally as one body. Although four elevation rods 134 are provided in the present embodiment, the number of elevation rods is not limited to four. Essentially, the number of elevation rods needs to be equal to or more than the number of elevation rods that are enough to move up and down the elevation ring 133 in parallel with the head body 116, e.g., three.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A vacuum processing apparatus comprising:
    a process chamber in which predetermined processing is performed on a target object in a predetermined vacuum condition;
    a mount stage provided in the process chamber, for mounting thereon the target object;
    a shower head provided so as to oppose to the mount stage, for supplying a process gas in the process chamber;
    an exhaust path provided in a housing forming the process chamber, and extending so as to surround the mount stage outside the mount stage;
    an exhaust port formed around the mount stage, for connecting the exhaust path with the process chamber;
    a porous member provided at the exhaust port so as to partition the exhaust path and the process chamber from each other, and having a plurality of ventilation holes for making the exhaust path communicating with the process chamber;
    branching means, provided at a communicating portion of the exhaust path, which communicates with the process chamber, in such a way as to provide a plurality of exhaust routes in the housing, for dividing a gas flowing from the process chamber through the ventilation holes of the porous member, into gases in a plurality of directions within the housing, such that the gases flow to the exhaust path through the plurality of exhaust routes;
    a plurality of upper exhaust pipes extending in a region located above the process chamber and communicating with the exhaust path; and
    a lower exhaust pipe extending toward a region located below the process chamber and communicating with all the upper exhaust pipes,
    wherein the gases from the branching means flow through the upper exhaust pipes into the lower exhaust pipe, and are combined by the lower exhaust pipe, and then exhausted therefrom toward the region located below the process chamber.

2. An apparatus according to claim 1, further comprising an exhaust bore formed in the housing and connecting the exhaust path with the upper exhaust pipes.

3. An apparatus according to claim 2, wherein the exhaust bore is provided at each of two positions symmetrical to each other with respect to the mount stage.

4. An apparatus according to claim 1, wherein the branching means branches the gas flowing from the process chamber through the ventilation holes of the porous member, into four directions.

5. An apparatus according to claim 4, wherein the branching means is constructed by two baffle plates provided at communicating portions of the exhaust path communicating with the upper exhaust pipes and extending along a curvature of the porous member, and each of the baffle plates forms exhaust portions at its both end portions.

6. An apparatus according to claim 1, wherein the plurality of upper exhaust pipes are two upper exhaust pipes.

7. An apparatus according to claim 1, wherein the lower exhaust pipe is provided under the process chamber and extends at a position at which the lower exhaust pipe avoids a heating device for heating the target object on the mount stage.

8. An apparatus according to claim 1, wherein the shower head comprises:
    a head body fixed to the housing;
    a porous disk located opposite to the mount stage, and connected to the head body such that the porous disk is movable up and down relative to the head body, the porous disk having a plurality of holes for use in injecting a process gas; and
    a diffusion chamber for making the process gas flow uniformly into the process chamber, the diffusion chamber being provided between the head body and the porous disk such that the diffusion chamber is partitioned by the head body and the porous disk.

9. An apparatus according to claim 8, further comprising an elevation mechanism for changing a distance between the porous disk and the mount stage by moving up and down the porous disk in relation to the body.

10. An apparatus according to claim 9, wherein the elevation mechanism includes a plurality of shafts extending so as to penetrate through the body of the shower head and supporting the porous disk, and a drive mechanism for moving up and down the plurality of shafts.

11. An apparatus according to claim 10, wherein a clearance is provided between each of the shafts and the body of the shower head.

12. An apparatus according to claim 11, further comprising sealing means provided between each of the shafts and the body of the shower head, for sealing the process chamber from outside.

13. An apparatus according to claim 10, wherein the porous disk is detachable from and attachable to the shafts.

14. A vacuum processing apparatus comprising:
a process chamber in which predetermined processing is performed on a target object in a predetermined vacuum condition;
a mount stage provided in the process chamber, on which the target object is to be mounted;
a shower head provided opposite to the mount stage, for supplying a process gas into the process chamber;
an exhaust path provided in a housing forming the process chamber, and extending so as to surround the mount stage outside the mount stage;
an exhaust port formed around the mount stage, and connecting the exhaust path with the process chamber;
a porous member provided at the exhaust port so as to partition the exhaust path and the process chamber from each other, and having a plurality of ventilation holes through which the exhaust path communicate with the process chamber;
branching means for dividing a gas flowing from the process chamber through the ventilation holes of the porous member, into gases in a plurality of directions, such that the gases flow to the exhaust path;
a plurality of upper exhaust pipes extending in a region located above the process chamber and communicating with the exhaust path; and
a lower exhaust pipe extending toward a region located below the process chamber and communicating with all the upper exhaust pipes,
wherein the branching means is constituted by two baffle plates which are located at communicating portions of the exhaust path in the housing which communicate with the process chamber, and which extend in such a way as to have a curvature substantially equal to a curvature of the porous member, each of said baffle plates having exhaust portions formed at both end portions of said baffle plates.

15. A vacuum processing apparatus comprising:
a process chamber in which predetermined processing is performed on a target object in a predetermined vacuum condition;
a mount stage provided in the process chamber, on which said target object is to be mounted;
a shower head for supplying a process gas into the process chamber, the shower head comprises (i) a head body fixed to a housing forming the process chamber, (ii) a porous disk located opposite to the mount stage, and connected to the head body such that the porous disk is movable up and down relative to the head body, the porous disk having a plurality of holes for use in injecting a process gas, and (iii) a diffusion chamber for making the process gas flow uniformly into the process chamber, the diffusion chamber being provided between the head body and the porous disk such that the diffusion chamber is partitioned by the head body and the porous disk; and
an elevation mechanism for moving up and down the porous disk relative to the head body, thereby changing a distance between the porous disk and the mount stage.

16. An apparatus according to claim 15, wherein:
the elevation mechanism comprises (i) a plurality of elevation shafts fixed to the porous disk, (ii) an elevation ring supporting the plurality of elevation shafts, (iii) a screw rod screwed into the elevation ring and supporting the elevation ring such that the elevation ring is movable up and down, and (iv) a motor for rotating the screw rod; and
the elevation mechanism drives the motor to rotate the screw rod, whereby the elevation ring is moved up and down to move up and down the porous disk fixed to the elevation shafts.

17. An apparatus according to claim 16, wherein the elevation shafts extend to the porous disk through penetration holes formed in the head body of the shower head.

18. An apparatus according to claim 17, wherein in the penetration holes of the head body, clearances are provided between the head body and the elevation shafts, respectively, and a plurality of sealing means for air-tightly sealing the diffusion chamber are provided in the clearances, respectively.

19. An apparatus according to claim 18, wherein each of the plurality of the sealing means comprises a bellows having ends, one of the ends being fixed to a bottom portion of an associated one of the penetration holes, and the other being fixed to an associated one of the elevation shafts, such that sealing between the bellows and said associated one of the penetration holes and sealing between the bellows and said associated one of the elevation shafts are achieved.

20. An apparatus according to claim 16, wherein the elevation shafts are detachably fixed to the porous disk.

* * * * *